(12) United States Patent
Meng et al.

(10) Patent No.: US 10,654,713 B2
(45) Date of Patent: *May 19, 2020

(54) METHOD FOR MANUFACTURING MICROELECTROMECHANICAL SYSTEM STRUCTURE HAVING A CAVITY AND THROUGH-HOLES OF DIFFERENT WIDTHS

(71) Applicant: Taiwan Semiconductor Manufacturing Co., Ltd., Hsinchu (TW)

(72) Inventors: Chin-Han Meng, Hsinchu (TW); Jr-Sheng Chen, Hsinchu (TW); Chih-Hsien Hsu, Hsinchu (TW); Yu-Pei Chiang, Hsinchu (TW); Lin-Ching Huang, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/398,091

(22) Filed: Apr. 29, 2019

(65) Prior Publication Data
US 2019/0256350 A1    Aug. 22, 2019

Related U.S. Application Data

(63) Continuation of application No. 15/884,919, filed on Jan. 31, 2018, now Pat. No. 10,273,152.

(60) Provisional application No. 62/563,878, filed on Sep. 27, 2017.

(51) Int. Cl.
B81C 1/00    (2006.01)

(52) U.S. Cl.
CPC ...... *B81C 1/00063* (2013.01); *B81C 1/00087* (2013.01); *B81C 1/00198* (2013.01); *B81C 1/00587* (2013.01); *B81C 2201/013* (2013.01)

(58) Field of Classification Search
CPC ............ B81C 1/00063; B81C 1/00087; B81C 1/00198; B81C 2201/013
See application file for complete search history.

(56) References Cited

U.S. PATENT DOCUMENTS 6,014,240 A * 1/2000 Floyd ................. G02B 26/0833
                                                    359/201.1
2005/0170656 A1    8/2005 Nasiri et al.

* cited by examiner

*Primary Examiner* — William F Kraig
*Assistant Examiner* — Vicki B. Booker
(74) *Attorney, Agent, or Firm* — Birch, Stewart, Kolasch & Birch, LLP (57) ABSTRACT

Methods for manufacturing MEMS structures are provided. The method for manufacturing a microelectromechanical system (MEMS) structure includes etching a MEMS substrate to form a first trench and a second trench and etching the MEMS substrate through the first trench and the second trench to form a first through hole and an extended second trench. The method for manufacturing a MEMS structure further includes etching the MEMS substrate through the extended second trench to form a second through hole. In addition, a height of the first trench is greater than ¾ of a height of the MEMS substrate, and a height of the second trench is smaller than ⅔ of the height of the MEMS substrate.

20 Claims, 7 Drawing Sheets

METHOD FOR MANUFACTURING MICROELECTROMECHANICAL SYSTEM STRUCTURE HAVING A CAVITY AND THROUGH-HOLES OF DIFFERENT WIDTHS

PRIORITY CLAIM AND CROSS-REFERENCE

This application is a Continuation application of U.S. patent application Ser. No. 15/884,919, filed on Jan. 31, 2018, the entirety of which is incorporated by reference herein. The U.S. patent application Ser. No. 15/884,919 claims the benefit of U.S. Provisional Application No. 62/563,878, filed on Sep. 27, 2017, and entitled "Method for manufacturing microelectromechanical system structure", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Semiconductor devices may include micro-electro-mechanical systems (MEMS) structures, including inertial sensors applications, such as motion sensors, accelerometers, and gyroscopes. Therefore, the technology of forming micro-structures with dimensions in the micrometer scale may be required.

Although existing manufacturing processes for MEMS structures may have been generally adequate for their intended purposes, as device scaling-down continues, they may have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments of methods for forming microelectromechanical system (MEMS) structures are provided. The methods may include etching a MEMS substrate to form a number of openings in the MEMS substrate. The etching processes used for forming the openings may be adjusted according to the loading effect when forming openings with various widths, so that the yield of the resulting MEMS structure may be improved.

Figure 1A:
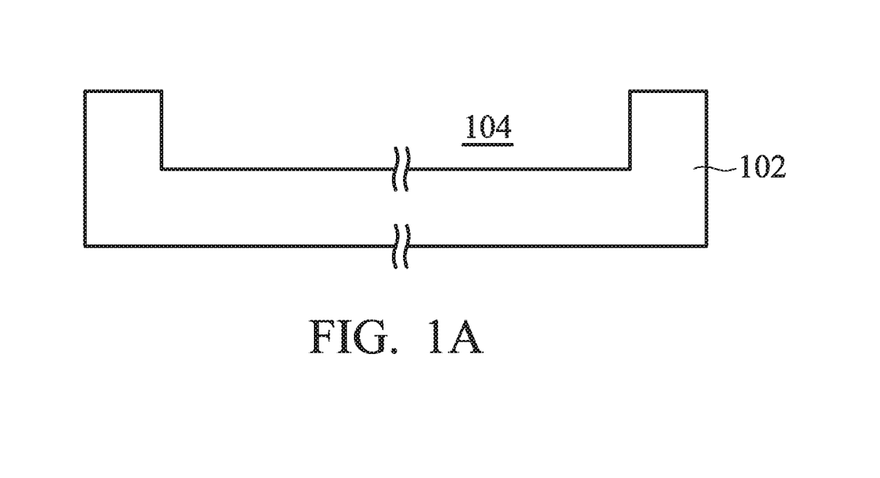
FIGS. 1A to 1F illustrate cross-sectional representations of various stages of forming a semiconductor structure, such as a MEMS structure, in accordance with some embodiments.

FIGS. 1A to 1F illustrate cross-sectional representations of various stages of forming a semiconductor structure, such as a MEMS structure 100, in accordance with some embodiments. As shown in FIG. 1A, a semiconductor substrate 102 is received in accordance with some embodiments. In some embodiments, the semiconductor substrate 102 is a complementary metal-oxide-semiconductor (CMOS) wafer at an intermediate stage of processing. In addition, the semiconductor substrate 102 has a recess 104 formed from the top surface of the semiconductor substrate 102, as shown in FIG. 1A in accordance with some embodiments. The recess 104 may be formed by, for example, etching, milling, a laser technique, combinations thereof, or the like.

The semiconductor substrate 102 may be a semiconductor wafer such as a silicon wafer. Alternatively or additionally, the semiconductor substrate 102 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and diamond. Examples of the compound semiconductor materials may include, but are not limited to, silicon carbide, gallium arsenic, gallium phosphide, indium phosphide, indium arsenide, and indium antimonide. Examples of the alloy semiconductor materials may include, but are not limited to, SiGe, GaAsP, AlInAs, AlGaAs, GaInAs, GaInP, and GaInAsP.

In some embodiments, the semiconductor substrate 102 includes structures such as doped regions including wells and source/drain regions, isolation features including shallow trench isolation (STI), inter-level dielectric (ILD) layers, and/or conductive features including gate electrodes, metal lines, vias, and contacts.

Figure 1B:
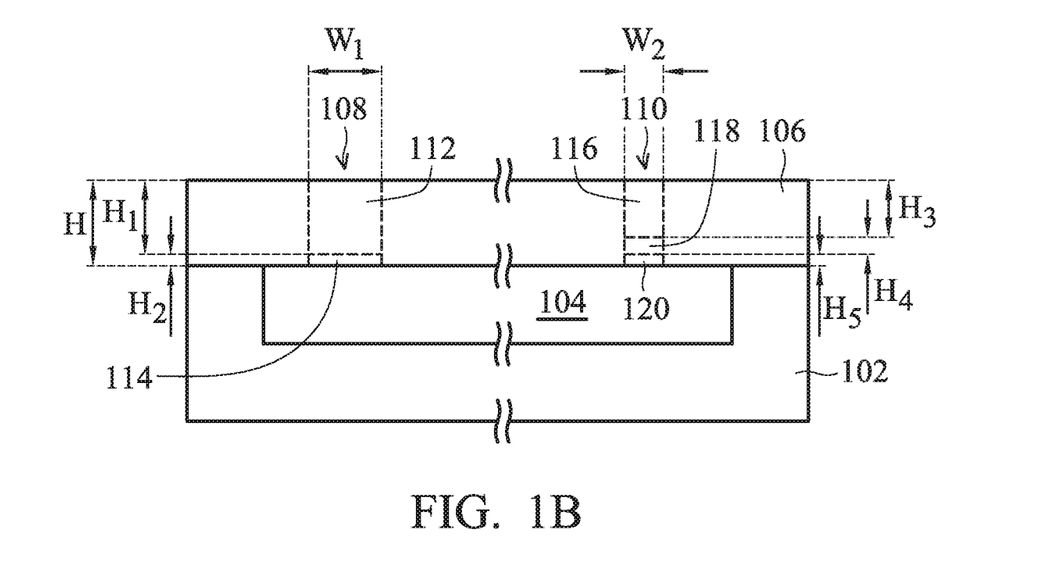

A MEMS substrate 106 is disposed over the top surface of the semiconductor substrate 102, as shown in FIG. 1B in accordance with some embodiments. In addition, the MEMS substrate 106 covers the recess 104 of the semiconductor substrate 102 in accordance with some embodiments. In some embodiments, the MEMS substrate 106 is a silicon wafer.

The MEMS substrate 106 and the semiconductor substrate 102 may be bonded by direct bonding, fusion bonding, thermo-compression bonding, glue bonding, eutectic bonding, or the like. The bonding process may further include the application of heat or pressure. In some embodiments, the MEMS substrate 106 may be doped with p-type and/or n-type of dopants by performing implantation processes or in-situ doping processes.

In some embodiments, the MEMS substrate 106 has a first region 108 and a second region 110, which are designed to be removed, such as by being etched, to form through holes in the MEMS substrate 106. The first region 108 has a first width $W_1$ and the second region 110 has a second width $W_2$ that is greater than the first width $W_1$. In some embodiments, the first width $W_1$ is in a range from about 1.8 μm to about 2.5 μm, and the second width $W_2$ is in a range from about 0.5 μm to about 1.5 μm. In some embodiments, the difference between the first width and the second width is in a range from about 0.5 μm to about 2 μm.

It should be noted that, although the first region 108 and the second region 110 are shown in FIG. 1B, the dotted lines in FIG. 1B are shown in order to provide a better understanding of the concept of the embodiments. That is, there may not be real interfaces at the edges of the first region 108 and the second region 110. In addition, the first region 108 and the second region 110 are made of the same material and have the same height in accordance with some embodiments. In some embodiments, both the first region 108 and the second region 110 are made of Si. In some embodiments, the first region 108 and the second region 110 have the same height H of the MEMS substrate 106.

As shown in FIG. 1B, the first region 108 may be divided into a top portion 112 having a height $H_1$ and a bottom portion 114 having a height $H_2$ directly under the top portion 112. In addition, the second region 110 may be divided into a top portion 116 having a height $H_3$, a middle portion 118 having a height $H_4$, and a bottom portion 120 having a height $H_5$. It should be noted that the top portion 112 and the bottom portion 114 of the first region 108 and the top portion 116, the middle portion 118, and the bottom portion 120 of the second region 110 are shown in order to provide a better understanding of the subsequent etching process, but there may not be real interfaces, or material differences, between each portion.

Figure 1C:
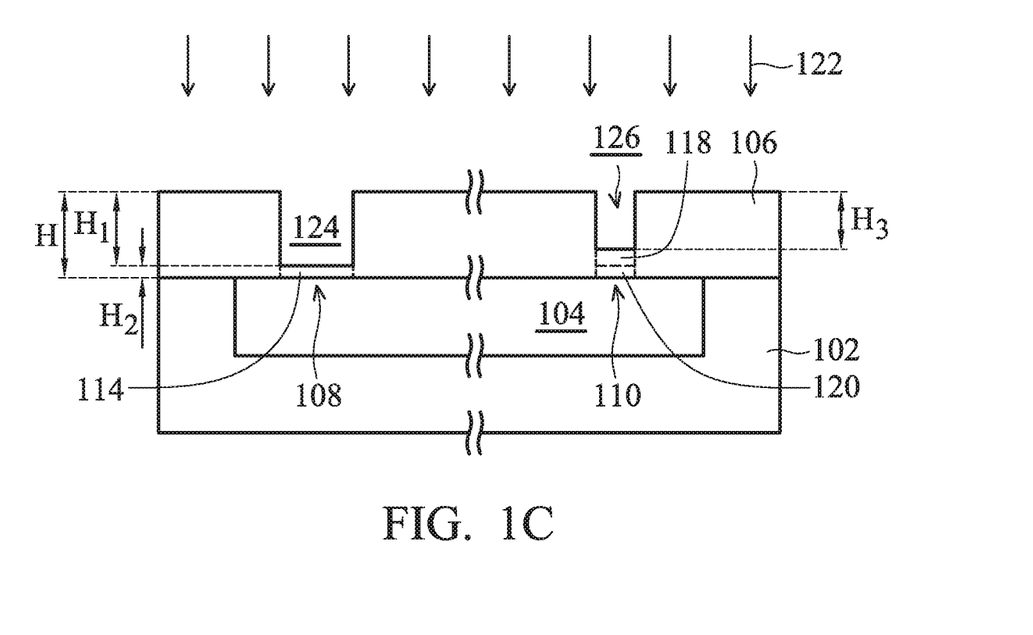

Next, a main etching process 122 is performed to etch the first region 108 and the second region 110 to form a first trench 124 and a second trench 126, as shown in FIG. 1C in accordance with some embodiments. More specifically, the top portion 112 of the first region 108 and a top portion 116 of the second region 110 are completely removed by performing the main etching process 112. As described previously, the first width $W_1$ of the first region 108 is greater than the second width $W_2$ of the second region 110. Therefore, during the main etching process 112, the etching rate of the top portion 112 of the first region 108 is greater than the etching rate of the top portion 116 of the second region 110 due to the loading effect. As shown in FIG. 1C, after the main etching process 122 is performed, the depth of the first trench 124 is greater than the depth of the second trench 126.

In some embodiments, the etching gas used in the main etching process 122 is $SF_6$. In some embodiments, $SF_6$ used in the main etching process 122 has a flow rate in a range of about 267 sccm to about 296 sccm. In some embodiments, $SF_6$ used in the main etching process 122 has a flow rate in a range of about 229 sccm to about 287 sccm. In some embodiments, a polymer gas, such as $C_4F_8$, is used in the main etching process as a protection gas. In some embodiments, $C_4F_8$ used in the main etching process 122 has a flow rate in a range of about 251 sccm to about 279 sccm. In some embodiments, $C_4F_8$ used in the main etching process 122 has a flow rate in a range of about 275 sccm to about 338 sccm. In some embodiments, the main etching process 122 is performed for about 105 sec to about 125 sec. In some embodiments, bias power used in the main etching process 122 is in a range of about 50 W to about 128 W. In some embodiments, bias power used in the main etching process 122 is in a range of about 47 W to about 113 W.

As shown in FIG. 1C, the main etching process 122 is adjusted to completely remove the top portion 112 of the first region 108 and the top portion 116 of the second region 110. Therefore, the height of the first trench 124 is substantially equal to the height $H_1$ of the top portion 112 of the first region 108, and the height of the second trench 126 is substantially equal to the height $H_3$ of the top portion 116 of the second region 110. In some embodiments, the height $H_1$ is greater than ¾ of the height H of the first region 108. In some embodiments, the height $H_3$ is smaller than ⅔ of the height H of the second region 110. In particular, the main etching process 122 may be designed to increase the difference between the etching rates at the first region 108 and the second region 110 by enhancing the loading effect during the main etching process 122, so that the resulting structure may have a better yield and performance (Details will be described later).

After the main etching process 122 is performed, an over-etching process is performed to form a wider through hole at the first region 108 and a narrower through hole 110 at the second region 110 in accordance with some embodiments. More specifically, during the over-etching process, the bottom portion 114 of the first region 108 is completely removed first due to its greater width $W_1$. After the bottom portion 114 is completely removed, the amount of etching gas in the second region 110 increases, and therefore the etching rate at the second region 110 in the over-etching process also increases, according to Le Chatelier's principle. That is, although the parameters used in the over-etching process are not changed during the whole etching process, the etching rate of the second region 110 changes when the bottom portion 114 of the first region 108 is completely removed.

In some embodiments, $SF_6$ used in the over-etching process has a flow rate in a range of about 201 sccm to about 222 sccm. In some embodiments, $SF_6$ used in the over-etching process has a flow rate in a range of about 173 sccm to about 215 sccm. In some embodiments, $C_4F_8$ used in the over-etching process has a flow rate in a range of about 251 sccm to about 279 sccm. In some embodiments, $C_4F_8$ used in the over-etching process has a flow rate in a range of about 258 sccm to about 319 sccm.

In some embodiments, bias power used in the over-etching process is in a range of about 5 W to about 48 W. In some embodiments, bias power used in the over-etching process is in a range of about 5.6 W to about 54 W. In some embodiments, the over-etching process is performed for about 80 sec to about 100 sec.

Figure 1D:
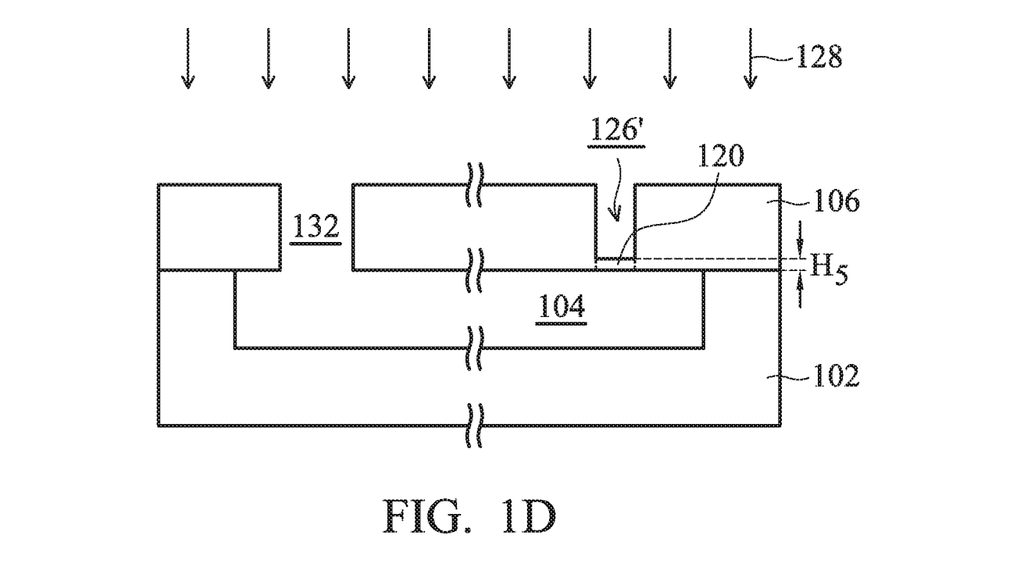

For a better understanding of the concept of the embodiments, a first step 128 and a second step 130 of the over-etching process may be defined accordingly. The first step 128 of the over-etching process is defined as the etching process performed in the time period in which both the bottom portion 114 of the first region 108 and the middle portion 118 of the second region 108 are etched, as shown in FIG. 1C in accordance with some embodiments. The second step 130 of the over-etching process is defined as the etching process performed in the time period in which only the bottom portion 120 of the second region 110 is etched, as shown in FIG. 1D in accordance with some embodiments.

More specifically, the first region 108 is completely removed by the first step 128 of the over-etching process to form a first through hole 132 in accordance with some embodiments. In addition, the middle portion 118 of the second region 110 is completely removed by the first step 128 of the over-etching process to form the extended trench 126'. In some embodiments, the height of the extended trench 126' is substantially equal to the sum of the height $H_3$ and $H_4$ and is greater than $\frac{3}{4}$ of the height H of the second region 110. That is, the height $H_5$ of the bottom portion 120 of the second region 110 is less than $\frac{1}{4}$ of the height H of the second region 110 in accordance with some embodiments. The over etching process is adjusted to remove appropriate amount at both the first step 128 and the second step 130 so that the resulting structure can have an improved performance. (Detail will be described later.)

Figure 1E:
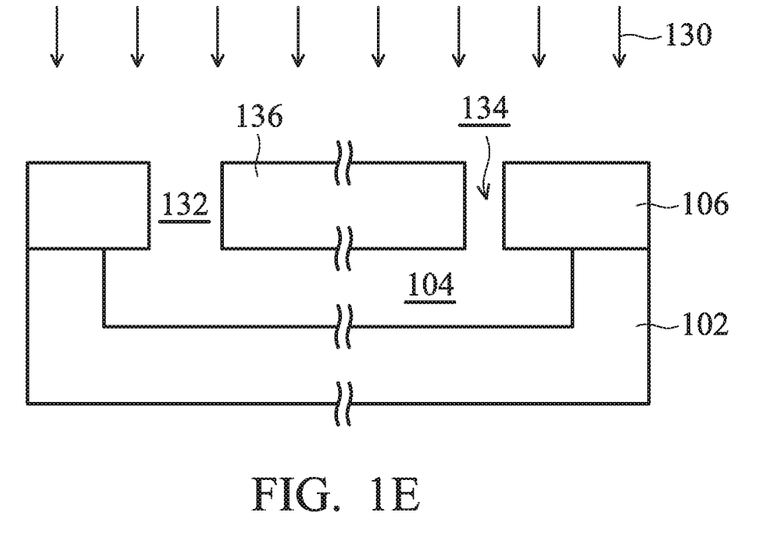

After the bottom portion 114 of the first region 108 is completely removed, the over-etching process proceeds to the second step 130, as shown in FIG. 1E in accordance with some embodiments. During the second step 130 of the over-etching process, the bottom portion 120 is completely removed to form a second through hole 134 in the MEMS substrate 106.

In some embodiments, the etching rate of the bottom portion 120 of the second region 110 of the MEMS substrate 106 is greater than the etching rate of the middle portion 118 of the second region 110. In some embodiments, the ratio of the etching rate of the bottom portion 120 to the etching rate of the middle portion 118 is greater than about 1.1. In some embodiments, the ratio of the etching rate of the bottom portion 120 to the etching rate of the middle portion 118 is in a range from about 1.1 to about 1.8. In some embodiments, the etching rate of the middle portion 118 is in a range from about 0.10 µm/cycle to about 0.14 µm/cycle. In some embodiments, the etching rate of the bottom portion 120 is in a range from about 0.14 µm/cycle to about 0.18 µm/cycle.

As described previously, when the bottom portion 114 is entirely removed by the first step 128 of the over-etching process, the etching rate of the second region 110 in the second step 130 of the over-etching process suddenly increases. Therefore, it may require much less time than expected for the bottom portion 120 of the second region 110 to be entirely etched away. Accordingly, the main etching process 122 and the over-etching process, including both the first step 128 and the second step 130, are designed to control the amounts of the first region 108 and the second region 110 removed in these etching process to prevent too much over-etching at the second region 110.

After the second step 130 of the over-etching process is performed, an element 136 may be formed between the first through hole 132 and the second through hole 134, as shown in FIG. 1E in accordance with some embodiments. In some embodiments, the element 136 is a movable element located over the recess 104 of the semiconductor substrate 102 used in a MEMS device to allow for free movement in at least one axis. The element 136 may be supported by hinges, springs, beams, or the like (not shown) which may extend from a static element. In some embodiments, both static elements and movable elements are formed between the first through hole 132 and the second through hole 134.

Figure 1F:
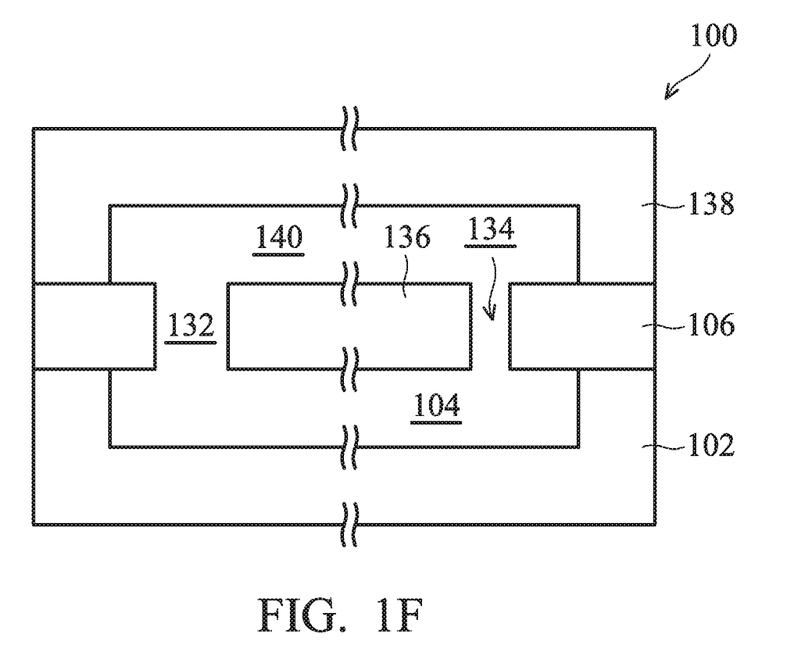

Afterwards, a cap substrate 138 is bonded to the MEMS substrate 106 to form a MEMS structure 100, as shown in FIG. 1F in accordance with some embodiments. In some embodiments, the cap substrate 138 is a cap wafer including interconnect structures, such as through substrate via (TSV), inside (not shown). In some embodiments, the cap substrate 138 includes a recess 140 located over the element 136 of the MEMS substrate 106. A bonding layer (not shown) may be formed between the MEMS substrate 106 and the cap substrate 138. For example, the bonding layer may include a polymer, an adhesive, a glass solder, a conductive material, or the like.

As shown in FIG. 1F, the first through hole 132 and the second through hole 134 are located between the recess 104 of the semiconductor substrate 102 and the recess 140 of the cap substrate 138 in accordance with some embodiments. In addition, the sidewall of the first through hole 132 and the sidewall of the second through hole 134 are not in direct contact with the semiconductor substrate 102 and the cap substrate 138 in accordance with some embodiments.

Generally, an etch stop layer may be used in an etching process to decide when to stop the etching process. However, when a numbers of openings with various widths need to be formed in the same substrate, many factors, such as loading effect, need to be concerned when the etching processes are designed. As described previously, the main etching process 122, the first step 128 of the over-etching process, and the second step 130 of the over-etching process are designed in accordance with the widths and the thicknesses of the first region 108 and the second region 110, so that when the over-etching process speeds up during the second step 130, damage to the structures formed in the substrate 102 exposed by the second through hole 134 due to the loading effect may be prevented or decreased.

In particular, the main etching process 122 and the over-etching process including the first step 128 and the second step 130 are designed to slow down the etching rates at the second region 110 to prevent too much over-etching below the second through hole 134. That is, it is designed to increase the difference between the etching rate at the first region 108 and the etching rate at the second region 110 by enhancing the loading effect during the main etching process 122 and the first step 128 and the second step 130 of the over-etching process. In addition, since the etching rate at the second step 130 of the over-etching process may suddenly increase due to the first region 108 being entirely removed at the first step 128, the increase of the etching rate in the second stage 130 is also taken into consideration when these etching processes are designed. Therefore, the amount of over-etching at the second through hole 134, the narrower through hole, may be decreased, and the accumulation of electrons under the second region 110 may also be reduced. It is found that the yield of the manufacturing processes described above may be improved for more than 50% in some embodiments. In addition, the performance of the resulting MEMS structure 100 may also be improved.

FIGS. 2A to 2E illustrate cross-sectional representations of various stages of forming a semiconductor structure, such as a MEMS structure 200, in accordance with some embodiments. The processes for forming the MEMS structure 200 may be similar to the processes for forming the MEMS structure 100 described above, except the etching processes used to form through holes are designed to prevent too much over-etching under the wider through hole. Some processes and materials used to form the MEMS structure 200 may be similar to, or the same as, those used to form the MEMS structure 100 described previously and may not be repeated herein.

Figure 2A:
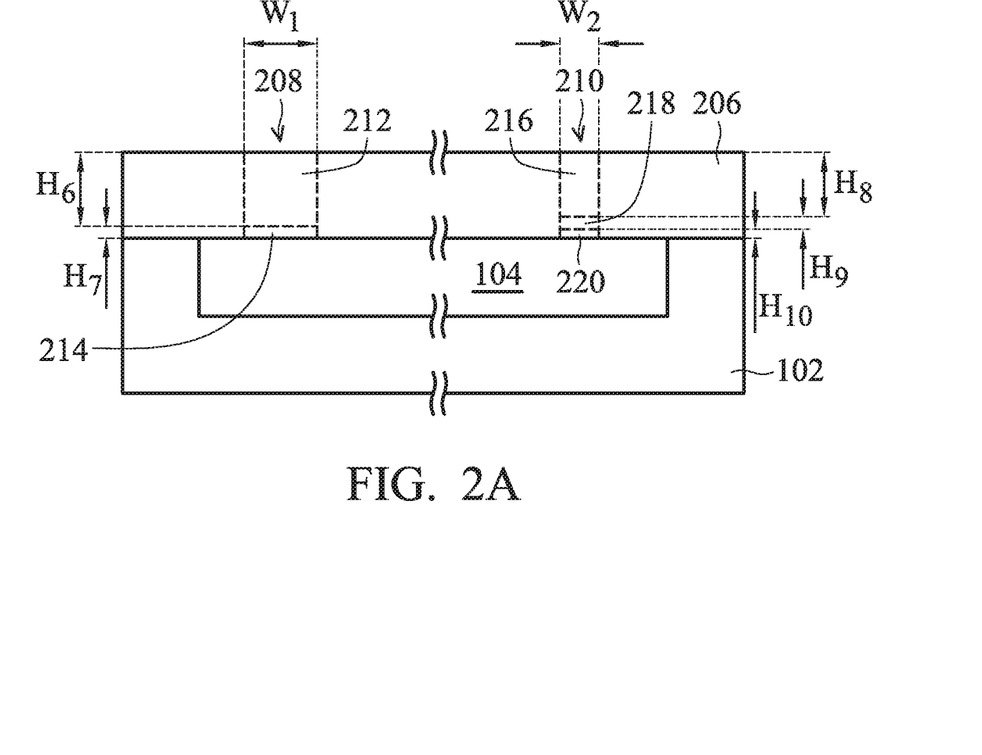
FIGS. 2A to 2E illustrate cross-sectional representations of various stages of forming a semiconductor structure, such as a MEMS structure, in accordance with some embodiments.

As shown in FIG. 2A, a MEMS substrate 206 is disposed over the top surface of the semiconductor substrate 102 in accordance with some embodiments. In addition, the MEMS substrate 206 covers the recess 104 of the semiconductor substrate 102 in accordance with some embodiments. The MEMS substrate 206 may be the same as, or similar to, the MEMS substrate 106 described previously and some details are not repeated herein.

Similar to the MEMS substrate 106, the MEMS substrate 206 has a first region 208 and a second region 210 which are designed to be removed, such as etched, to form through holes in the MEMS substrate 206. The first region 208 may have the width the same as the first width $W_1$ of the first region 108 and the second region 210 may have the width the same as the second width $W_2$ of the first region 110 described above. As shown in FIG. 2A, the first region 208 may be divided into a top portion 212 having a height $H_6$ and a bottom portion 214 having a height $H_7$ directly under the top portion 212. In addition, the second region 210 may be divided into a top portion 216 having a height $H_8$, a middle portion 218 having a height $H_9$, and a bottom portion 220 having a height $H_{10}$.

Figure 2B:
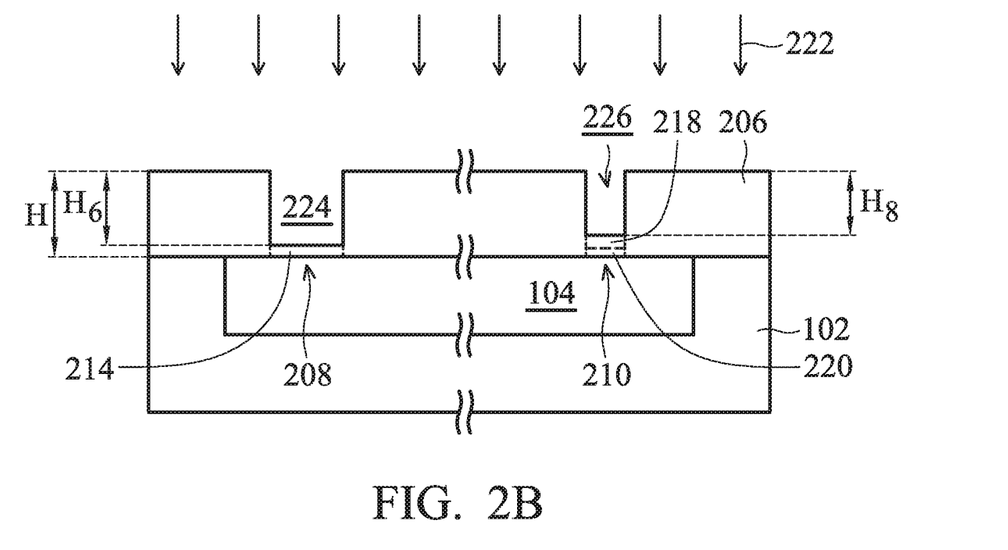

Next, a main etching process 222 is performed to etch the top portion 222 of the first region 208 and the top portion 216 of the second region 210 to form a first trench 224 and a second trench 226, as shown in FIG. 2B in accordance with some embodiments.

In some embodiments, an etching gas used in the main etching process 222 is $SF_6$. In some embodiments, $SF_6$ used in the main etching process 222 has a flow rate of in a range of about 215 sccm to about 271 sccm. In some embodiments, $C_4F_8$ used in the main etching process 222 has a flow rate of in a range of about 275 sccm to about 337 sccm. In some embodiments, a bias power used in the main etching process 222 is in a range of about 59 W to about 144 W.

In some embodiments, the height $H_6$ of the top portion 212 (i.e. the height of the first trench 224) is greater than ¾ of the height H of the first region 208. In some embodiments, the height $H_8$ of the top portion 216 (i.e. the height of the second trench 226) is greater than ¾ of the height H of the second region 210. In particular, the main etching process 222 may be designed to decrease the difference between the etching rates at the first region 208 and the second region 210 by minimizing the loading effect during the main etching process 222, so that the resulting structure may have a better yield and performance (Details will be described later).

Figure 2C:
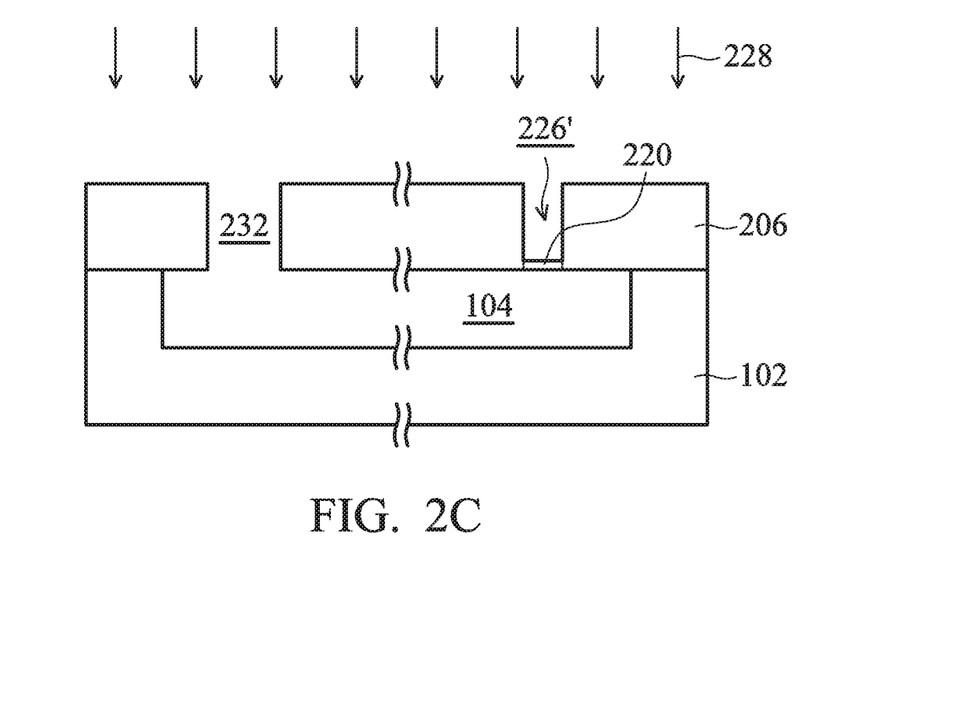
Figure 2D:
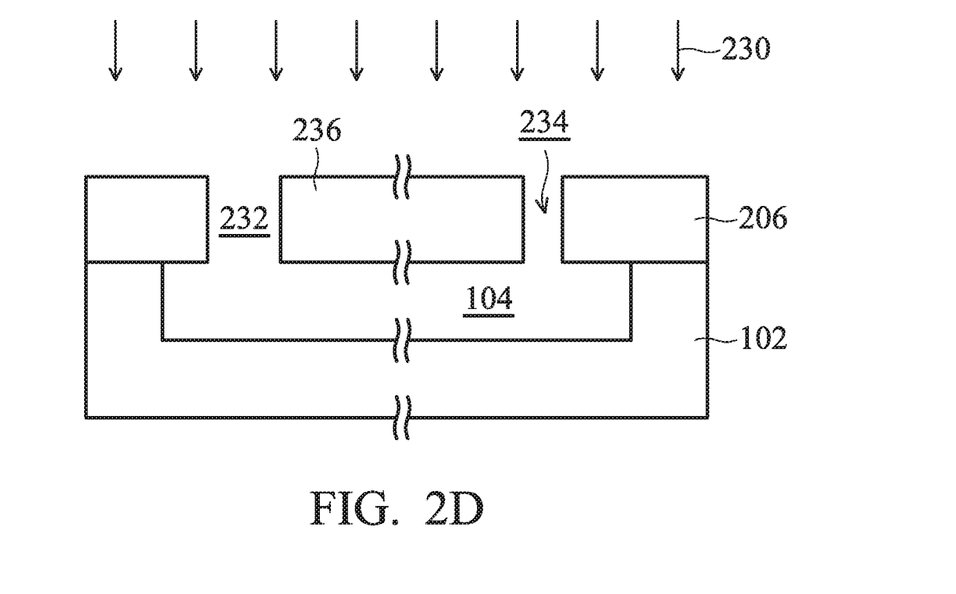

After the main etching process 222 is performed, an over-etching process, including a first step 228 and a second step 230, is performed to etch through the first trench 224 and the second trench 226, as shown in FIGS. 2C and 2D in accordance with some embodiments. In some embodiments, the parameters used in the first step 228 and the second step 230 of the over-etching process are the same.

In some embodiments, a flow rate of $SF_6$ used in the over-etching process is in a range of about 207 sccm to about 254 sccm. In some embodiments, a flow rate of $C_4F_8$ used in the over-etching process is in a range of about 216 sccm to about 271 sccm. In some embodiments, a bias power used in the over-etching process is in a range of about 4.4 W to about 43 W.

The first step 228 of the over-etching process is defined as the etching process performed in the time period in which both the bottom portion 214 of the first region 208 and the middle portion 218 of the second region 208 are etched, as shown in FIG. 2B in accordance with some embodiments. The second step 230 of the over-etching process is defined as the etching process performed in the time period in which only the bottom portion 220 of the second region 210 is etched, as shown in FIG. 2C in accordance with some embodiments.

More specifically, the first region 208 is completely removed to form a first through hole 232 and the middle portion 218 of the second region 210 is completely removed to form the extended trench 126' during the first step 228 of the over-etching process. In some embodiments, the height of the extended trench 226' is substantially equal to the sum of the height $H_8$ and $H_9$ and is greater than ⅘ of the height H of the second region 210. That is, the height $H_{10}$ of the bottom portion 220 of the second region 210 is less than ⅕ of the height H of the second region 210 in accordance with some embodiments. The over etching process is adjusted to remove appropriate amount at both the first step 228 and the second step 230 so that the resulting structure can have an improved performance. (Detail will be described later.)

After the bottom portion 214 of the first region 108 is completely removed, the over-etching process proceeds to the second step 230 to form a second through hole 234 in the MEMS substrate 206, as shown in FIG. 2D in accordance with some embodiments.

In some embodiments, the etching rate of the middle portion 218 is in a range from about 0.14 μm/cycle to about 0.18 μm/cycle. In some embodiments, the etching rate of the bottom portion 120 is in a range from about 0.18 μm/cycle to about 0.22 μm/cycle.

As described previously, the main etching process 222 and the over-etching process, including both the first step 228 and the second step 230, are designed to control the amounts of the first region 208 and the second region 210 removed in these etching process to prevent too much over-etching at the first region 210.

Figure 2E:
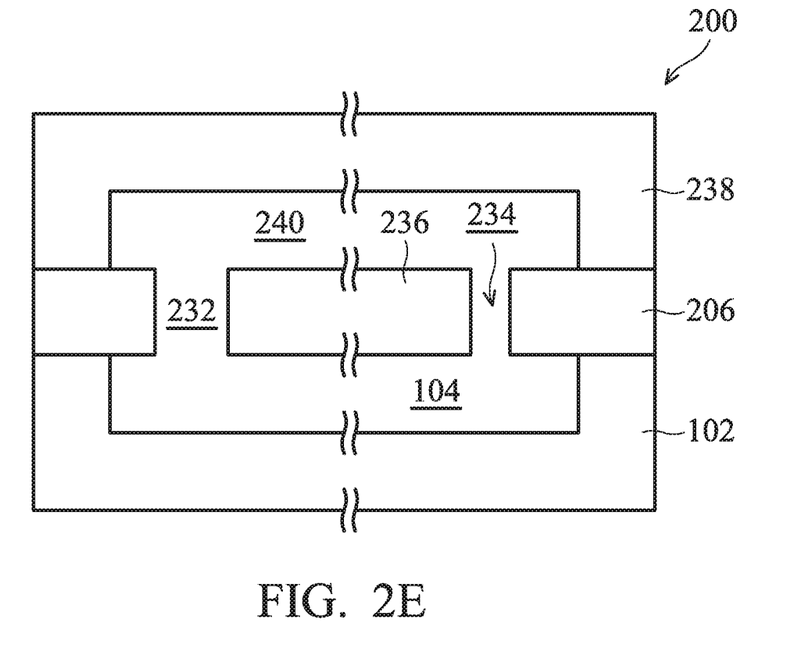

After the second step 230 of the over-etching process is performed, an element 236 may be formed between the first through hole 232 and the second through hole 234, as shown in FIG. 2D in accordance with some embodiments. The element 236 may be similar to, or the same as, the element 136 described previously and therefore the details of the element 236 are not repeated herein. Afterwards, a cap substrate 238, similar to the cap substrate 138, is bonded to the MEMS substrate 206 to form a MEMS structure 200, as shown in FIG. 2E in accordance with some embodiments. In some embodiments, the cap substrate 238 includes a recess 240 over the element 236.

As described previously, the main etching process 222, the first step 228 of the over-etching process, and the second step 230 of the over-etching process are designed in accordance with the widths and the thicknesses of the first region 208 and the second region 210. In particular, the main etching process 222, the first step 228 of the over-etching process, and the second step 230 of the over-etching process may be designed to decrease the difference between the etching rates at the first region 208 and the second region 210 by minimizing the loading effect. Therefore, the amount of over-etching at the first through hole 234, the wider through hole, may be decreased, and the risk of damaging the structure under the first region 208 may also be reduced. Accordingly, the performance of the resulting MEMS structure 200 may be improved.

Figure 3:
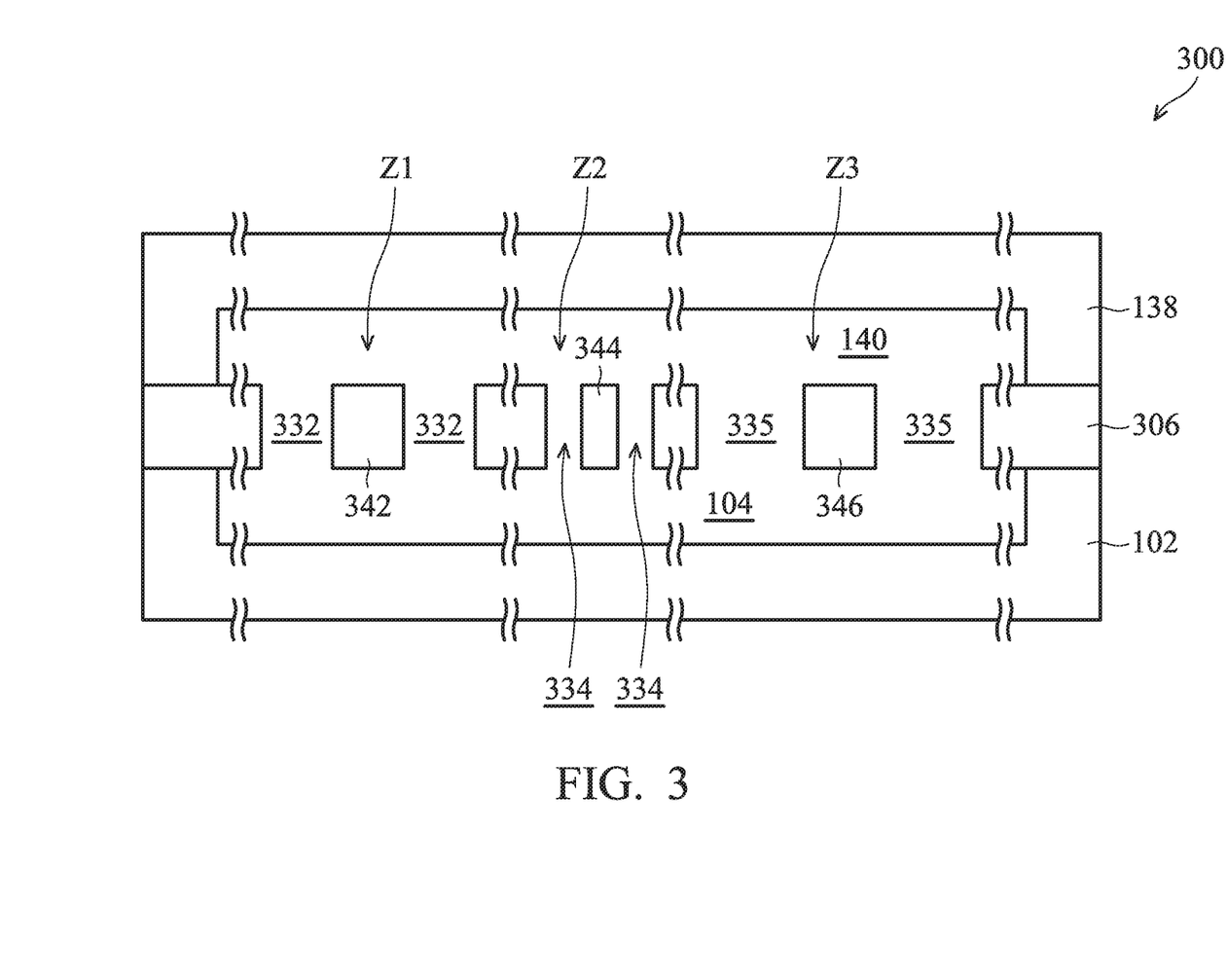
FIG. 3 illustrates a cross-sectional representation of a semiconductor structure, such as a MEMS structure, in accordance with some embodiments.

FIG. 3 illustrates a cross-sectional representation of a semiconductor structure, such as a MEMS structure 300, in accordance with some embodiments. The processes for forming the MEMS structure 300 may be similar to the processes for forming the MEMS structures 100 and 200 described above, and therefore the processes and materials used to form the MEMS structure 300 may be similar to, or the same as, those used to form the MEMS structures 100 and 200 described previously and may not be repeated herein.

Similar to the MEMS structures 100 and 200, the MEMS structure 300 includes a MEMS substrate 306 located between the semiconductor substrate 102 and the cap substrate 138, as shown in FIG. 3 in accordance with some embodiments. In addition, trenches 332, 334, and 335 having different widths are formed in the MEMS substrate 306 in accordance with some embodiments. Since the widths of the trenches 332, 334, and 335 are different, the etching rate form forming these trenches may also be different during the same etching process due to the loading effect. Accordingly, a main etching process and an over-etching process may be designed, as described previously and shown in FIGS. 1A to 2E, to have appropriate etching rate at different stages of the etching processes to prevent too much over-etching during the manufacturing processes for forming the trenches 332, 334, and 335.

The MEMS substrate 306 may include a first zone Z1, a second zone Z2, and a third zone Z3, and the trenches 332, 334, and 335 may be formed in the different zones of the MEMS substrate 306 for different purpose. In some embodiments, the trenches 332 are formed in the first zone Z1 to define an element 342 between the trenches 332. The trenches 332 may be similar to, or the same as, the first trenches 132 and 232 described previously. In some embodiments, the element 342 is a movable element formed in a sensing/moving combination zone.

In some embodiments, the trenches 334 are formed in the second zone Z2 to define an element 344 between the trenches 334. The trenches 334 may be similar to, or the same as, the second trenches 134 and 234 described previously. In some embodiments, the element 344 is a ground element formed in a grounding zone for transferring electrons to neutralize the structure.

In some embodiments, the trenches 335 are formed in the third zone Z3 to define an element 346 between the trenches 335. The width of the trenches 335 may be greater than both the trenches 332 and 334. In some embodiments, the element 346 is formed in a periphery of the MEMS substrate 306. In some embodiments, the trenches 335 surround a numbers of movable elements, such as the elements 342 or 344 in the MEMS substrate 306 (not shown). In some embodiments, the width of the trench 335 is in a range from about 100 μm to about 1000 μm. In some embodiments, the difference between the width of the trenches 332 or 334 is in a range from about 100 μm to about 1000 μm.

It should be noted that, the arrangement of the trenches in FIGS. 1A to 3 are shown for better understanding the concept of the disclosure, and the scope of the disclosure is not intended to be limiting. That is, a numbers of trenches with various widths may be formed in a MEMS substrate and the pattern of these trenches may be designed according to its application.

As described previously, a main etching process (e.g. the main etching processes 122 and 222), a first step of the over-etching process (e.g. the first step 128 and 228), and a second step of the over-etching process (e.g. the second step 130 and 230) are designed in accordance with the widths and the thicknesses of the desired through holes, so that too much over-etching under these trenches may be prevented.

More specifically, the bias power and the flow rates of the etching gas used the main etching process and the over-etching process may be adjusted in accordance with the loading effect during these etching processes. In some embodiments, the bias power and the flow rates of the etching gas used the main etching process and the over-etching process are adjusted to enhance the loading effect during these etching process, so that the amount of the over-etching under the narrower trench in the MEMS substrate can be decreased. In some embodiments, the bias power and the flow rates of the etching gas used the main etching process and the over-etching process are adjusted to minimize the loading effect during these etching process, so that the amount of the over-etching under the wider trench in the MEMS substrate can be decreased. In addition, the difference of the etching rates in the first step and the second step of the over-etching processes has also be considered when these etching process are designed. Accordingly, the performance of the resulting MEMS structure may be improved.

Embodiments of methods for manufacturing a MEMS structure are provided. The method may include forming a first through hole and a second through hole in a MEMS substrate. A main etching process and an over-etching process may be performed to form the first through hole and the second through hole. In addition, the firth through hole and the second through hole may have different widths and therefore the etching rates for forming the first through hole and the second through hole may also be different due to the loading effect. Therefore, the main etching process and the over-etching process may be designed in accordance with the widths of the first through hole and the second through hole to prevent too much over-etching during the over-etching process. Accordingly, the yield for forming the MEMS structure and the performance of the resulting MEMS structure can be improved.

In some embodiments, a method for manufacturing a microelectromechanical system (MEMS) structure is provided. The method for manufacturing a microelectromechanical system (MEMS) structure includes etching a MEMS substrate to form a first trench and a second trench and etching the MEMS substrate through the first trench and the second trench to form a first through hole and an extended second trench. The method for manufacturing a MEMS structure further includes etching the MEMS substrate through the extended second trench to form a second through hole. In addition, a height of the first trench is greater than ¾ of a height of the MEMS substrate, and a height of the second trench is smaller than ⅔ of the height of the MEMS substrate.

In some embodiments, a method for manufacturing a microelectromechanical system (MEMS) structure is provided. The method for manufacturing a microelectromechanical system (MEMS) structure includes disposing a MEMS substrate over a semiconductor substrate. In addition, the MEMS substrate includes a first region and a second region over a recess of the semiconductor substrate. The method for manufacturing a MEMS structure further includes etching a top portion of the first region and a top portion of the second region of the MEMS substrate in a main etching process and etching a bottom portion of the first region to form a first through hole and a middle portion of the second region in a first step of an over-etching process. The method for manufacturing a MEMS structure further includes etching a bottom portion of the second region to form a second through hole in a second step of the over-etching process after the first step of the over-etching process is performed. In addition, an etching rate of the bottom portion of the second region in the second step of the over-etching process is greater than an etching rate of the middle portion of the second region in the first step of the over-etching process.

In some embodiments, a method for manufacturing a microelectromechanical system (MEMS) structure is provided. The method for manufacturing a microelectromechanical system (MEMS) structure includes etching a first region of a MEMS substrate to form a first trench and etching a second region of the MEMS substrate to form a second trench in a main etching process and etching through the first region through the first trench to form a first through hole and partially etching the second region through the second trench to form an extended second trench in a first step of an over-etching process. The method for manufacturing a MEMS structure further includes etching through the second region through the extended second trench to form a second through hole in a second step of the over-etching process. In addition, the first region is wider than the second region and an ratio of an etching rate of the bottom portion of the second region to an etching rate of the middle portion of the second region is greater than about 1.1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a microelectromechanical system (MEMS) structure, comprising:
    etching a MEMS substrate to form a first trench and a second trench;
    etching the MEMS substrate through the first trench and the second trench to form a first through hole and an extended second trench; and
    etching the MEMS substrate through the extended second trench to form a second through hole,
    wherein a height of the first trench is greater than ¾ of a height of the MEMS substrate, and a height of the second trench is smaller than ⅔ of the height of the MEMS substrate.

2. The method for manufacturing a microelectromechanical system structure as claimed in claim 1, wherein a movable element is formed between the first through hole and the second through hole.

3. The method for manufacturing a microelectromechanical system structure as claimed in claim 2, further comprising:
    disposing the MEMS substrate over a semiconductor substrate; and
    disposing a cap substrate over the MEM substrate,
    wherein the first through hole and the second through hole are located over a recess of the semiconductor substrate.

4. The method for manufacturing a microelectromechanical system structure as claimed in claim 2, wherein the first trench is wider than the second trench.

5. The method for manufacturing a microelectromechanical system structure as claimed in claim 1, where a height of the extended second trench is greater than ¾ of the height of the MEMS substrate.

6. The method for manufacturing a microelectromechanical system structure as claimed in claim 1, wherein etching the MEMS substrate through the extended second trench to form the second through hole comprises using $SF_6$.

7. The method for manufacturing a microelectromechanical system structure as claimed in claim 1, wherein the first trench is wider than the second trench, and a difference between a width of the first trench and a width of the second trench is in a range from about 0.5 μm to about 2 μm.

8. A method for manufacturing a microelectromechanical system (MEMS) structure, comprising:
    disposing a MEMS substrate over a semiconductor substrate, wherein the MEMS substrate comprises a first region and a second region over a recess of the semiconductor substrate;
    etching a top portion of the first region and a top portion of the second region of the MEMS substrate in a main etching process;
    etching a bottom portion of the first region to form a first through hole and a middle portion of the second region in a first step of an over-etching process; and
    etching a bottom portion of the second region to form a second through hole in a second step of the over-etching process after the first step of the over-etching process is performed,
    wherein an etching rate of the bottom portion of the second region in the second step of the over-etching process is greater than an etching rate of the middle portion of the second region in the first step of the over-etching process.

9. The method for manufacturing a microelectromechanical system structure as claimed in claim 8, wherein an etching rate of the top portion of the first region in the main etching process is greater than an etching rate of the top portion of the second region in the main etching process.

10. The method for manufacturing a microelectromechanical system structure as claimed in claim 8, wherein the first region is wider than the second region.

11. The method for manufacturing a microelectromechanical system structure as claimed in claim 10, wherein a thickness of the first region is substantially equal to a thickness of the second region before the main etching process is performed.

12. The method for manufacturing a microelectromechanical system structure as claimed in claim 10, wherein a difference between a width of the first trench and a width of the second trench is in a range from about 0.5 μm to about 2 μm.

13. The method for manufacturing a microelectromechanical system structure as claimed in claim 8, wherein a movable element is formed between the first through hole and the second through hole.

14. The method for manufacturing a microelectromechanical system structure as claimed in claim 8, wherein a height of the top portion of the first region is greater than a height of top portion of the second region.

15. The method for manufacturing a microelectromechanical system structure as claimed in claim 8, wherein the main etching process and the first step of the over-etching process comprise using a same etchant under different flow rates.

16. The method for manufacturing a microelectromechanical system structure as claimed in claim 8, wherein a sum of a height of the top portion of the second region and a height of the middle portion of the second region is greater than ¾ of a height of the MEMS substrate.

17. A method for manufacturing a microelectromechanical system (MEMS) structure, comprising:

etching a first region of a MEMS substrate to form a first trench and etching a second region of the MEMS substrate to form a second trench in a main etching process;

etching through the first region by etching through the first trench to form a first through hole and partially etching the second region by etching through the second trench to form an extended second trench in a first step of an over-etching process; and etching through the second region by etching through the extended second trench to form a second through hole in a second step of the over-etching process, wherein the first region is wider than the second region and an ratio of an etching rate of a bottom portion of the second region to an etching rate of a middle portion of the second region is greater than about 1.1.

18. The method for manufacturing a microelectromechanical system structure as claimed in claim 17, wherein the main etching process comprises using $SF_6$.

19. The method for manufacturing a microelectromechanical system structure as claimed in claim 18, wherein the first step of the over-etching process also comprises using $SF_6$, and a flow rate of the $SF_6$ used in the first step of the over-etching process is different from a flow rate of the $SF_6$ used in the main etching process.

20. The method for manufacturing a microelectromechanical system structure as claimed in claim 17, wherein a movable element is formed between the first through hole and the second through hole.

* * * * *